(12) United States Patent
Sakaguchi et al.

(10) Patent No.: US 7,211,370 B2
(45) Date of Patent: May 1, 2007

(54) METHOD FOR DICING WAFER

(75) Inventors: Hideaki Sakaguchi, Nagano (JP);
Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 490 days.

(21) Appl. No.: 10/757,498

(22) Filed: Jan. 15, 2004

(65) Prior Publication Data
US 2004/0142284 A1 Jul. 22, 2004

(30) Foreign Application Priority Data
Jan. 20, 2003 (JP) .............................. 2003-011336

(51) Int. Cl.
*G03F 7/26* (2006.01)

(52) U.S. Cl. ...................... 430/313; 430/311; 438/463

(58) Field of Classification Search ................ 430/311, 430/313, 329; 438/460, 462, 463
See application file for complete search history.

(56) References Cited

U.S. PATENT DOCUMENTS

| | | | |
|---|---|---|---|
| 5,181,984 A | 1/1993 | Matsumura et al. | |
| 5,223,083 A | 6/1993 | Cathey et al. | |
| 5,972,781 A | 10/1999 | Wegleiter et al. | |
| 6,025,461 A | 2/2000 | Chiang et al. | |
| 6,455,945 B1 | 9/2002 | Ishii et al. | |
| 6,521,513 B1 * | 2/2003 | Lebens et al. | ............... 438/462 |
| 6,699,646 B2 | 3/2004 | Imai et al. | |
| 6,806,032 B2 | 10/2004 | Takanashi et al. | |
| 6,916,594 B2 | 7/2005 | Bok et al. | |
| 6,979,588 B2 | 12/2005 | Jeong et al. | |
| 7,067,236 B2 | 6/2006 | Yamada et al. | |

FOREIGN PATENT DOCUMENTS

| | | |
|---|---|---|
| EP | 1 026 735 | 8/2000 |
| JP | 57-172750 | 10/1982 |
| JP | 4-116849 | 4/1992 |
| JP | 8-279478 | 10/1996 |
| JP | 2000-306875 | 11/2000 |

* cited by examiner

*Primary Examiner*—Kathleen Duda
(74) *Attorney, Agent, or Firm*—Staas & Halsey LLP

(57) ABSTRACT

A method for dicing a wafer, in which a wafer having a plurality of electronic circuits formed at one side thereof is diced into individual semiconductor chips, the method comprising the steps of:

coating the side of the wafer opposed to the side at which the plurality of electronic circuits are formed with a layer of a photosensitive resist, exposing the photosensitive resist layer by irradiating it with a radiation capable of penetrating the wafer, at the side having the electronic circuits formed, and along the dicing lines, for subsequently cutting the wafer for the dicing, developing the photosensitive resist layer to thereby selectively remove the material at the exposed portions of the resist layer along the dicing lines, and dicing the wafer by etching it, at the side opposed to the side having the electronic circuits, to cut the wafer along the dicing lines.

11 Claims, 4 Drawing Sheets

METHOD FOR DICING WAFER

BACKGROUND OF THE INVENTION

1. Field of the Invention

The invention relates to a method, for dicing a wafer, in which a wafer having a plurality of electronic circuits formed at one side thereof is diced, to thereby separate it into the plurality of semiconductor chips.

2. Description of the Related Art

Recent electronic instruments are required to be increasingly small and light and, accordingly, semiconductor packages used in an electronic instrument and thus semiconductor chips incorporated in semiconductor packages are expected to be made small and light. This is accompanied by the development of demand that a wafer, prior to its dicing, and from which semiconductor chips are obtained, has a very small thickness, such as of 50 micrometers or smaller.

When a wafer, such as a silicon wafer, is formed so as to have a very small thickness, such as 50 micrometers or smaller, problems can arise. For example, such a thin wafer can crack during the steps from the formation to the dicing thereof.

For this reason, various ideas of handling and dicing a thin wafer, without causing it to be damaged, have been proposed.

For example, as described in JP 2000-306875 A, the side of a wafer having circuits formed, to which a dicing tape is applied, is sucked onto a vacuum chuck table through the dicing tape, and the wafer is thinned by grinding the back side of the wafer opposed to the circuit-forming side (FIG. 9 and paragraphs 0031–0033 of JP 2000-306875 A). Subsequently, the wafer is diced by irradiating the back side thereof with infrared rays penetrating through the wafer, at the scribing line (marking) formed along the dicing line for the wafer, observing the scribing line by the use of an infrared camera, and controlling and moving a dicing saw along the scribing line (FIGS. 10 and 11 and paragraphs 0037–0038 of JP 2000-306875 A).

According to the method described in JP 2000-306875 A, operations for grinding a wafer to make it thinner, the wafer having a protective tape applied to the circuit-forming side thereof for the protection during the grinding, then removing the protective tape, and placing the wafer on a dicing tape (FIG. 4 and paragraphs 0008–0010 of JP 2000-306875 A), are not necessary, and effects, such as prevention of crack of the thin wafer, can be obtained (paragraph 0042 of JP 2000-306875 A).

In the above prior art, there is also a method in which the wafer is diced by irradiating it with a laser beam along the dicing line to melt the wafer, in place of the use of the dicing saw.

The above prior methods have a problem that a dicing saw, which is made, in general, of a rotating diamond blade or the like, is used in the step of dicing, and cracks, breaks of the edges, flaws or the like can be developed in a wafer (or diced semiconductor chips), resulting in the deterioration in quality and production yield of semiconductor chips.

The above prior methods also have a problem that an image pickup means, such as an infrared camera, capable of picking up special transmitted light from the wafer, such as infrared rays, is needed, leading to the increased cost of equipment.

Further, the prior method, in which a wafer is diced by cutting it using a laser beam in place of a dicing saw, has a problem that diced chips may have protuberances (so-called debris) at their cut edges due to the melting of the cut portions of the wafer by the laser beam, or circuits in the wafer may be damaged due to heat, resulting in the deterioration in quality and production yield of semiconductor chips.

SUMMARY OF THE INVENTION

The invention is intended to solve the above problems, and has an object to provide a method for dicing a wafer, which can enhance the quality and production yield of semiconductor chips by not developing cracks, breaks of edges, flaws, debris or circuit damage in the semiconductor chips resulting from dicing of a wafer, and which allows a wafer to be diced into chips with high accuracy in alignment, and can moderate the cost of equipment.

Thus, there is provided a method for dicing a wafer, in which a wafer having a plurality of electronic circuits formed at one side thereof is diced into individual semiconductor chips, the method comprising the steps of: coating the side of the wafer opposed to the side at which the plurality of electronic circuits are formed with a layer of a photosensitive resist, exposing the photosensitive resist layer by irradiating it with a radiation capable of penetrating the wafer, at the side having the electronic circuits formed, and along the dicing lines for subsequently cutting the wafer for the dicing, developing the photosensitive resist layer to thereby selectively remove the material at the exposed portions of the resist layer along the dicing lines, and dicing the wafer by etching it at the side opposed to the side having the electronic circuits formed to cut the wafer along the dicing lines.

According to the invention, the wafer is irradiated at the side having the electronic circuits formed with the radiation capable of penetrating the wafer, for the subsequent selective removal of the material of the photosensitive resist layer along the dicing lines. This means that the arrangement of the circuits, and markings, such as scribing lines, drawn in the wafer along the dicing lines can be identified during the irradiation, and the wafer can be irradiated, along the dicing lines, with radiation with high accuracy, resulting in semiconductor chips, with a good peripheral contour, diced from the wafer. For the identification of the circuit arrangement and the markings, a means for picking up a visible image may be used, and no special means, such as an infrared camera, is required. Thus, the cost of equipment for carrying out the method of the invention may be lowered.

In addition, according to the invention, the wafer is diced by etching, without using a dicing saw or laser beam. As a result, the semiconductor chips divided from the wafer are free of cracks, breaks of edges, flaws, debris or circuit damage. Particularly, the wafer is etched at the side opposed to the side having the electronic circuits formed and, consequently, there is no risk of the electronic circuits being adversely affected by the etching, and damage to the circuits is avoided.

Preferably, the wafer is diced by dry etching.

The method of the invention may further comprise, following the step of dicing the wafer, a step of removing the photosensitive resist layer from the wafer.

The photosensitive resist layer may be formed of a positive-type photosensitive material. In this case, the wafer can be irradiated at the side having the electronic circuits formed with the radiation along the dicing lines. Thus, the electronic circuits are prevented from being irradiated with radiation, and are not damaged due to the energy of the radiation even if the radiation has a high energy.

The photosensitive resist layer may also be formed of a negative-type photosensitive material. Also, in this case, the wafer can be irradiated, at the side having the electronic circuits, with radiation, along the dicing lines, using a mask member having a pattern to selectively expose the photosensitive resist layer to the radiation.

The photosensitive resist layer may be formed of an X-ray sensitive or infrared sensitive material. The X-ray sensitive material allows to use a radiation having a short wavelength, good linear propagation properties, and a high penetrability, which in turn allows irradiation of the dicing lines through the wafer with high accuracy, providing semiconductor chips diced from the wafer and having a peripheral contour formed with high accuracy. The infrared sensitive material allows to use a radiation which has a high penetrability, is safer for a human body compared with X rays, and can be easily handled. Particularly, the infrared rays do not damage the electronic circuits even if they directly irradiate the circuits.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 4:
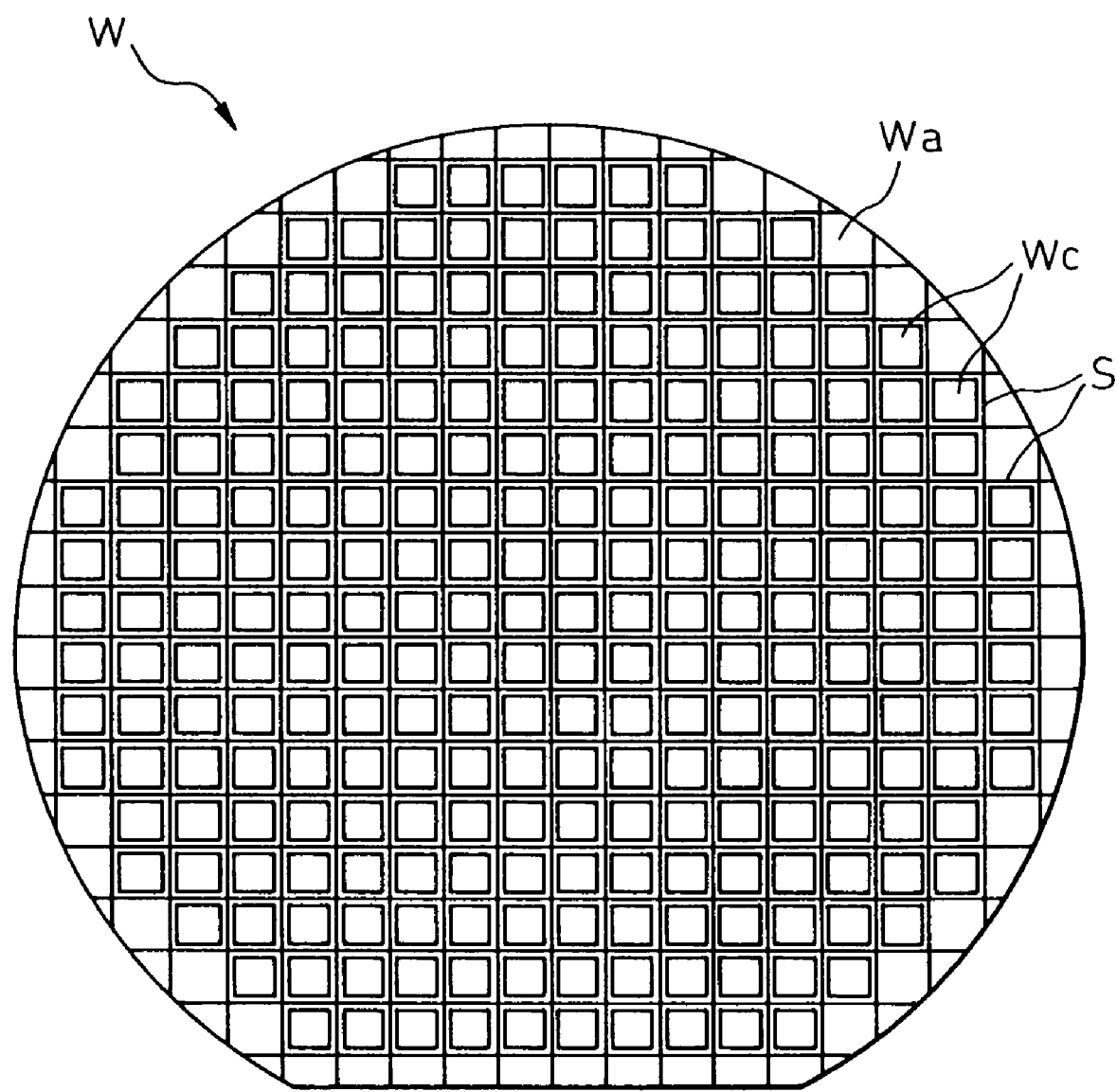
FIG. 4 shows the circuit-forming side of a wafer.

A wafer W, to which the method for dicing a wafer of the invention is applied, is shown in FIG. 4. The wafer W is formed, in a flat plate-like shape, from a semiconductor material, such as silicon. A great number of electronic circuits Wc are formed on a grid, at one side of the wafer Wa (hereinafter called a circuit-forming side). By cutting (dicing) the wafer W between the adjacent electronic circuits Wc, the wafer W can be divided into a plurality of individual semiconductor chips.

At the circuit-forming side of the wafer W, scribing lines S are formed along the dicing lines (the lines for cutting the wafer during the dicing) between the adjacent electronic circuits Wc. The scribing line is a marking (or marker) to identify the location of the dicing line during the dicing of the wafer W. The scribing lines S can be formed at the circuit-forming side Wa by, for example, a process for etching the circuit-forming side Wa.

The markings, such as scribing lines S, are not necessarily needed to be formed along the entirety of each of the dicing lines, as seen in FIG. 4. For the formation of the marking, various methods may be used, including the formation of spot-like markings at the two ends of one dicing line.

Also, when the dicing lines are identified based on the electronic circuits Wc, the markings, such as scribing lines S, are not necessarily formed.

Referring to FIGS. 1A to 1G, an embodiment of the method for dicing a wafer of the invention will now be described.

Figure 1A:
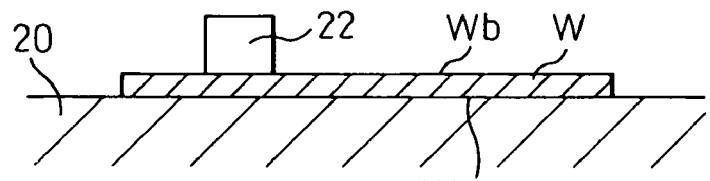
FIG. 1A to 1G show, in a step-wise manner, an embodiment of the method for dicing a wafer of the invention.

As shown in FIG. 1A, which illustrates a grinding step, a wafer W is placed on a wafer support 20 so that one side Wa thereof at which electronic circuits Wc (FIG. 4) are formed (i.e., the circuit-forming side) is brought into contact with the support 20 through a protecting tape (not shown), and the opposite side Wb of the wafer W is ground by a grinding means 22 so that the ground wafer W has a desired thickness.

Figure 1B:
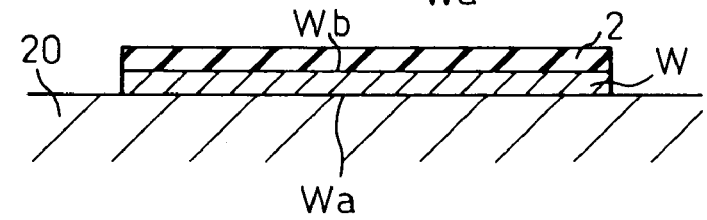

Subsequently, as shown in FIG. 1B, the opposite side Wb of the wafer W is coated with a photosensitive resist layer 2 (a step of the formation of a resist layer). The resist layer forming step can be carried out by, for example, applying a paste-like photosensitive resin material to the opposite side Wb of the wafer W. In this embodiment, PMMA (polymethyl methacrylate) is used as the photosensitive resin material forming the photosensitive resist layer 2. PMMA is a positive-type X-ray sensitive resin material, and has the nature of a portion exposed to X-ray being capable of being removed by development.

Figure 1C:
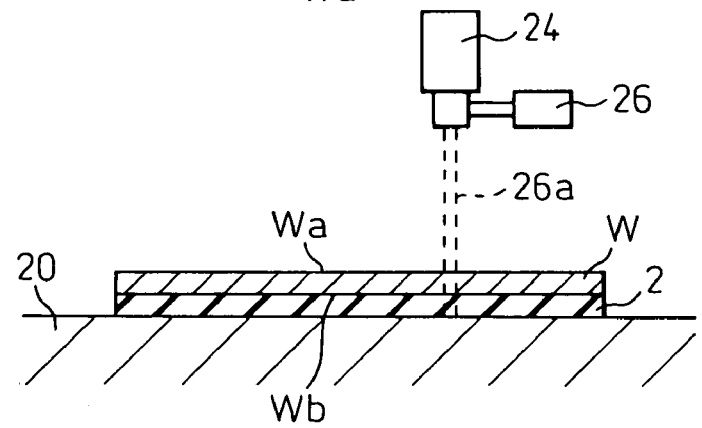

As shown in FIG. 1C, the wafer W is then turned over and placed on the wafer support 20, so that the circuit-forming side Wa becomes the upside and becomes exposed. X rays 26a having a wavelength of 0.01 to 50 nanometers, preferably about 0.4 nanometer, are irradiated toward the wafer W along scribing lines S (FIG. 2), the X rays being transmitted through the wafer W (a step of exposure).

Figure 2:
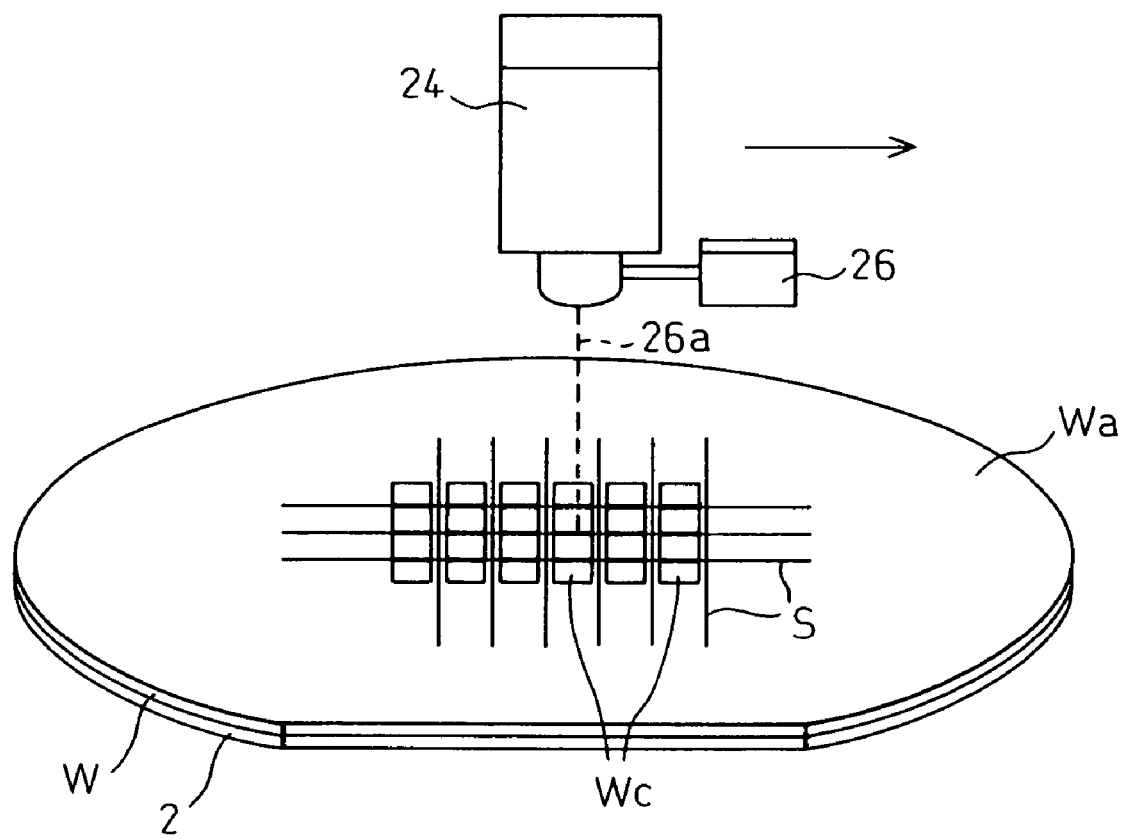
FIG. 2 illustrates the step of exposure in the embodiment shown in FIG. 1C.

As illustrated in FIG. 1C and the perspective view of FIG. 2, in the step of exposure, a system comprising the following equipment and devices are used: a camera 24 provided over the wafer support 20 so as to be capable of picking up the image of wafer W on the wafer support 20; a lighting means 26 capable of irradiating the wafer W with spot-like X rays 26a, as a radiation capable of penetrating through the wafer W, concentrically with the axis of lens of the camera 24; a means for moving the camera, which is not shown in the drawings, and which can move the camera 24 in a plane parallel to the face of the wafer W on the wafer support 20; and a controlling unit, such as a computer, which is also not shown in the drawings, connected to the camera 24 so as to be able to communicate therewith, receiving image information of the wafer W picked up by the camera 24 to allow analyze the scribing lines S provided in the wafer W, and controlling, based on the result of the analysis, the means for moving the camera 24 to thereby move it along the scribing line S.

In the step of exposure, the camera 24 picks up the image of the circuit-forming side Wa of the wafer W on the support 20, and the controlling unit identifies the scribing lines S in the wafer W, based on the image information from the camera 24, and controls the means for moving the camera, based on the identified results, to thereby move the camera 24 along the scribing line S. When the camera 24 is moved along the scribing line S, the wafer W is irradiated with the spot-like X rays 26a concentrically with the axis of lens of the camera 24 by the lighting means 26, along the scribing line S. The X rays 26a pass through the wafer W of silicon and, accordingly, the photosensitive resist layer 2 on the back side (bottom side) of the wafer W is also irradiated with the X rays 26a, as shown in FIG. 1C. Consequently, the photosensitive resist layer 2 becomes exposed along the scribing line S.

Figure 1D:
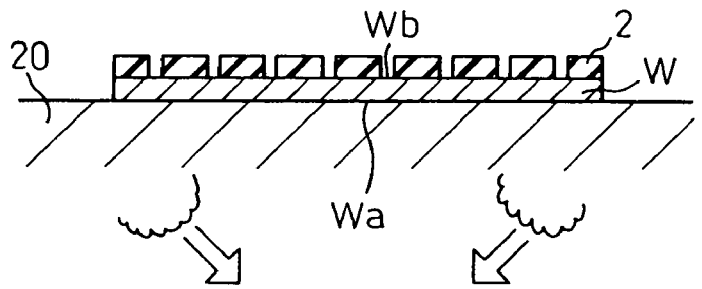

Following the step of exposure, the wafer W is turned over, and the photosensitive resist layer 2 is subjected to a step of development, as shown in FIG. 1D. For the photosensitive resist layer 2, a positive-type X-ray sensitive resin material, such as PMMA, is used. Accordingly, portions exposed to the X rays, i.e., portions of the photosensitive resist layer 2 along the scribing lines, are removed in the step of development.

The step of exposure and the step of development constitute a photolithography step.

Figure 1E:
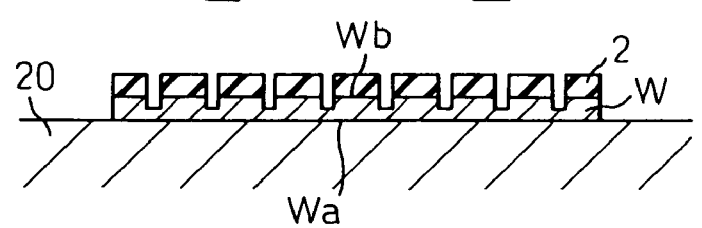
Figure 1F:
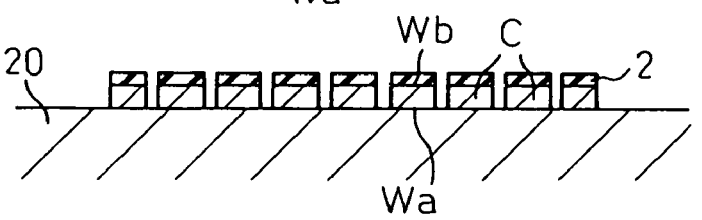

The wafer W is then dry etched from its top side, i.e., the side Wb opposed to the circuit-forming side Wa, to be diced (the step of dicing), as shown FIGS. 1E and 1F. For example, a reactive ion etching (RIE) process can be used for the dry etching, to thereby suitably etch the wafer, which is formed of silicon or the like, for the dicing thereof. In order to make the etching rate of the photoresist layer 2 smaller compared to that of the wafer, a material, such as a resin, for example PMMA, which does not chemically react during the dry etching, or a resin which has a higher hardness than that of silicon, is used. In this way, only the portions of the wafer W which are not coated with the photosensitive resist layer 2 but are exposed, i.e., the portions along the dicing lines, can be etched, to thereby cut the wafer W along the dicing lines.

Figure 1G:
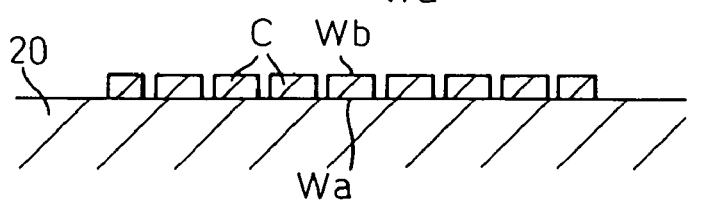

Subsequently, the photosensitive resist layer 2 is peeled and removed from the wafer (in other words, from the respective semiconductor chips C isolated from each other in the step of dicing) (the step of removal of the resist layer), as shown in FIG. 1G.

The peeling of the photosensitive resist layer 2 (the step of removal of the resist layer) may be not necessarily carried out, when the photosensitive resist layer 2 is not problematic for the use of the semiconductor chip C even if it remains deposited on the side Wb opposed to the circuit-forming side Wa of the semiconductor chip C.

According to the method for dicing a wafer of this embodiment, the wafer W is cut (diced) by dry etching, without using a dicing saw or laser beam and, consequently, the diced semiconductor chip C does not suffer from cracks, breaks of edges, flaws, debris or circuit damage. According to the invention, such a semiconductor chip free of cracks, breaks of edges, flaws, debris or circuit damage can be obtained even if the chip is diced from a thin wafer having a thickness of 50 micrometers or smaller.

Further, the wafer W is irradiated at the circuit-forming side Wa with the X rays 26a, which pass through the wafer W, and, consequently, the scribing lines S drawn at the circuit-forming side Wa can be identified, and the radiation penetrating through the wafer can be directed to the scribing lines S at a high accuracy of alignment, to thereby provide the diced semiconductor chips C with a peripheral contour of high accuracy.

In addition, by the use of a positive-type photosensitive material for the photosensitive resist layer 2, and by irradiating the wafer W along the dicing lines, the photosensitive resist layer 2 can be removed along the dicing lines and, consequently, the electronic circuits Wc are not subjected to the irradiation with the X rays 26a, which prevents breakdown of the electronic circuits Wc due to the energy of the X rays 26a.

According to the above embodiment, the step of the exposure of the photosensitive resist layer 2 can be performed through a system comprising the camera 24 capable of picking up images of normal visible light, the lighting means 26 capable of emitting radiation penetrating through the wafer W, such as X rays, the means for moving the camera 24, and the controlling unit for analyzing the image information from the camera 24 and controlling the means for moving the camera 24.

By the use of X rays having a short wavelength, good linear propagation properties, and a high penetrability, the dicing lines in a wafer can be irradiated with radiation penetrating through the wafer with high accuracy, and the semiconductor chips C diced from the wafer and having a peripheral contour formed at a high accuracy can be produced.

In the above embodiment, the photosensitive resist layer 2 is formed at the side Wb opposed to the circuit-forming side Wa of the wafer W. The photosensitive resist layer may be formed at the circuit-forming side of a wafer, and the wafer may be diced by dry etching the wafer at the circuit-forming side. In this case, however, electronic circuits can be damaged during the application and peeling of a photosensitive layer 2 on the electronic circuits or during the dry etching of the wafer at the circuit-forming side, which is not preferred for the quality of the electronic circuits.

The invention is not limited to the above embodiment, and various modifications may be made within the invention.

Figure 3:
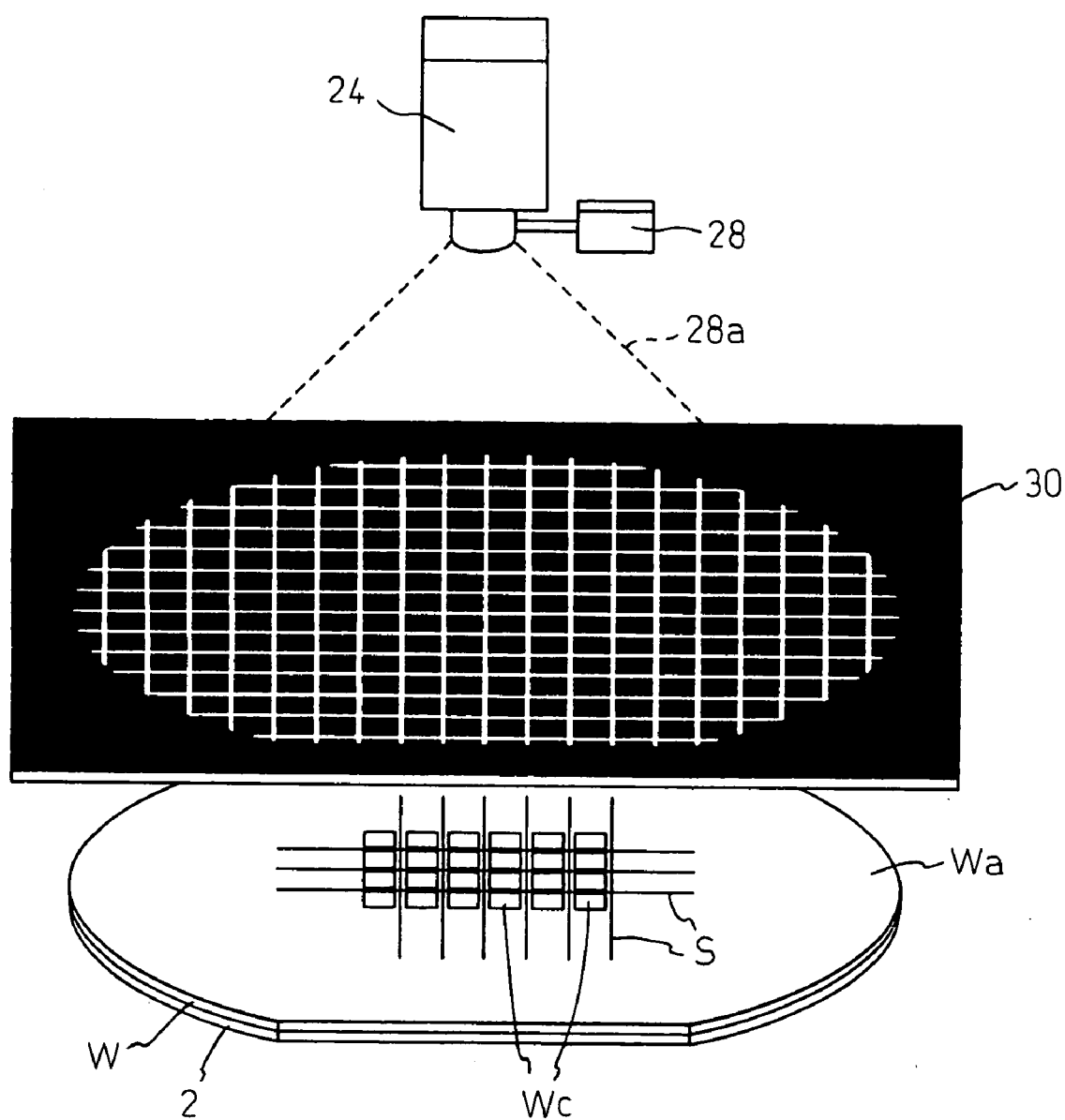
FIG. 3 illustrates the step of exposure in another embodiment of the method of the invention.

For example, the step of exposure is not limited to moving the camera 24, which is accompanied by the movement of the spot-like radiation directed to the wafer W. By way of example, an alternative process for irradiating a wafer with a penetrating radiation along dicing lines may be used. In the alternative process, as shown in FIG. 3, a lighting means (light source) 28 is provided, the lighting means being capable of radially emitting a penetrating radiation 28a concentrically with the axis of lens of the camera 24. A mask member 30, in which slits for passing the emitted radiation 28a therethrough to direct it only along the dicing lines in a wafer W, is positioned between the lighting means 28 and the wafer W, preferably at the location at which the mask member 30 is nearly in contact with the wafer W, by aligning the slits in the mask member 30 with the locations of the scribing lines in the wafer W by the use of the camera 24 and a controlling unit (not shown) for controlling the movement of the mask member 30 to position it in place. Subsequently, the penetrating radiation 28a is emitted by the lighting means 28 to thereby irradiate the wafer W along the dicing lines. In this case, for portions of the mask member 30 blocking the penetrating radiation 28a, a material comprising lead, which is opaque to X rays, may be used.

Also, the penetrating radiation is not limited to X rays. For example, infrared rays may be used as the penetrating light. In this case, a resin material of a infrared-photosensitive type, which can be exposed to infrared rays and can be developed, may be used for a photosensitive resist layer. Infrared rays allow the use of penetrating radiation which has high penetrability, is safer for a human body compared with X rays, and can be easily handled.

Further, in the case of the use of infrared rays as a penetrating radiation, unlike the case of the use of X rays, electronic circuits are not broken even if they are irradiated with the radiation. Therefore, in the case of the use of infrared rays, a negative-type photosensitive material, which can be cured at exposed portions thereof to thereby allow the portions having been not exposed to be removed by development, can also be used for a photosensitive resist layer. In this case, a system used for the step of exposure comprises a lighting means capable of emitting infrared rays, in place of the lighting means 28 emitting X rays in FIG. 3, and a mask member is formed so as to have a pattern, which is contrary to the pattern of the mask member 30 in FIG. 3, and which blocks the infrared rays only at the locations corresponding to the dicing lines in a wafer.

The invention is not limited to the application to the dicing of a wafer, and is also applicable to the formation of through holes or recesses in a member, made of silicon, such as a wafer.

As described, the method for dicing a wafer of the invention can enhance the quality and production yield of semiconductor chips due to not developing cracks, breaks of edges, flaws, debris or circuit damage in the semiconductor chips resulting from dicing of a wafer, and allows a wafer to be diced into individual chips with high accuracy and can moderate the cost of equipment.

The invention claimed is:

1. A method for dicing a silicon wafer, in which a wafer having a plurality of electronic circuits formed at one side thereof is diced into individual semiconductor chips, the method comprising:
    coating the side of the wafer opposed to the side at which the plurality of electronic circuits are formed with a layer of a photosensitive resist,
    exposing the photosensitive resist layer by irradiating it with a radiation capable of penetrating the wafer, at the side having the electronic circuits formed, and along the dicing lines for subsequently cutting the wafer for the dicing,
    developing the photosensitive resist layer to thereby selectively remove the material at the exposed portions of the resist layer along the dicing lines, and
    dicing the wafer by etching it at the side opposed to the side having the electronic circuits formed to cut the wafer along the dicing lines,
    wherein the radiation irradiating the photosensitive resist layer is at least one of X-ray and infrared ray radiation.

2. The method of claim 1, wherein the wafer is diced by dry etching.

3. The method of claim 1, further comprising, after said dicing the wafer, removing the photosensitive resist layer from the wafer.

4. The method of claim 1, wherein the photosensitive resist layer is formed of a positive-type photosensitive material.

5. The method of claim 1, wherein the photosensitive resist layer is formed of a negative-type photosensitive material.

6. The method of claim 5, wherein the negative-type photosensitive material is an infrared-sensitive material.

7. The method of claim 1, wherein the wafer is irradiated with spot-like radiation, which is moved along the dicing line.

8. The method of claim 7, wherein for the irradiation with the spot-like radiation, a system comprising a camera for picking up images of normal visible light, a lighting means for emitting radiation penetrating through the wafer, a means for moving the camera, and a controlling unit for analyzing the image information from the camera and controlling the means for moving the camera, is used.

9. The method of claim 1, wherein the wafer is irradiated with a radially emitted radiation using a mask, so as to be exposed to the radiation passing through the mask along the dicing line.

10. The method of claim 9 wherein, for the irradiation with the radially emitted radiation, a system comprising a camera for picking up images of normal visible light, a lighting means for radially emitting radiation penetrating through the wafer, a mask member having a pattern to selectively expose the photosensitive resist layer to the radiation, and a controlling unit for analyzing the image information from the camera and controlling the movement of the mask to position it in place.

11. A method for preparing a wafer having a plurality of electronic circuits formed at one side thereof for dicing into individual semiconductor chips, the method comprising the steps of:
    coating the side of the wafer opposed to the side at which the plurality of electronic circuits are formed with a layer of a photosensitive resist;
    exposing the photosensitive resist layer by irradiating it with a radiation capable of penetrating the wafer, at the side having the electronic circuits formed, and along dicing lines for subsequently cutting the wafer for the dicing; and
    developing the photosensitive resist layer to thereby selectively remove the material at the exposed portions of the resist layer along the dicing lines.

* * * * *